United States Patent
Harada et al.

(10) Patent No.: US 8,662,437 B2
(45) Date of Patent: Mar. 4, 2014

(54) WIRE BOBBIN HOLDER OF BOBBIN CASSETTE IN WIRING APPARATUS

(75) Inventors: Keitaro Harada, Yamagata (JP);
Masayoshi Yokoo, Yamagata (JP);
Koichi Yoshida, Yamagata (JP); Akio Murakami, Yamagata (JP)

(73) Assignee: Tohoku Seiki Industries, Ltd., Yamagata-shi, Yamagata (JP)

( * ) Notice: Subject to any disclaimer, the term of this patent is extended or adjusted under 35 U.S.C. 154(b) by 620 days.

(21) Appl. No.: 12/680,130

(22) PCT Filed: Sep. 25, 2007

(86) PCT No.: PCT/JP2007/069148
§ 371 (c)(1),
(2), (4) Date: Mar. 25, 2010

(87) PCT Pub. No.: WO2009/040956
PCT Pub. Date: Apr. 2, 2009

(65) Prior Publication Data
US 2011/0049286 A1 Mar. 3, 2011

(51) Int. Cl.
*B65H 59/04* (2006.01)

(52) U.S. Cl.
USPC .............. 242/421.2; 242/422.2; 242/423.1; 242/156.2

(58) Field of Classification Search
USPC ........ 242/416, 421, 421.2, 422.2, 423, 423.1, 242/423.2, 156, 156.2
See application file for complete search history.

(56) References Cited

U.S. PATENT DOCUMENTS

| | | | |
|---|---|---|---|
| 2,964,440 A * | 12/1960 | Stevens | 156/178 |
| 5,735,967 A | 4/1998 | Yakou et al. | |
| 2005/0242224 A1* | 11/2005 | Shiraishi et al. | 242/421.1 |

FOREIGN PATENT DOCUMENTS

| | | |
|---|---|---|
| GB | 1 355 017 | 3/1974 |
| JP | 2-62378 | 2/1990 |
| JP | 8-245076 | 9/1996 |
| JP | 9-27626 | 1/1997 |
| JP | 2001-135166 | 5/2001 |
| JP | 2006-137512 | 6/2006 |
| JP | 2006-347121 | 12/2006 |
| TW | 1252184 | 4/2006 |

OTHER PUBLICATIONS

Machine translation of JP 08-245076 A, Sep. 24, 1996.*
European Search Report for corresponding application No. EP 07 82 8889 mailed May 20, 2011.
Taiwanese Office Action for corresponding application No. 097136958 mailed Jun. 24, 2013.

* cited by examiner

*Primary Examiner* — William E Dondero
(74) *Attorney, Agent, or Firm* — Merchant & Gould P.C.

(57) ABSTRACT

When current collecting wires are laid in parallel with each other on a solar cell on which a photosensitive film is formed, a wire tension adjusting mechanism is provided which includes a bobbin holder shaft pivotally held on the side of a frame in a bobbin cassette in a wiring apparatus and a wire bobbin is detachably fixed on the bobbin holder shaft. The wire tension adjusting mechanism further includes a pre-load means for adjusting the torque of the bobbin holder shaft and the tension of each current collecting wire to be drawn out from the wire bobbin held by the bobbin shaft is adjusted.

4 Claims, 13 Drawing Sheets

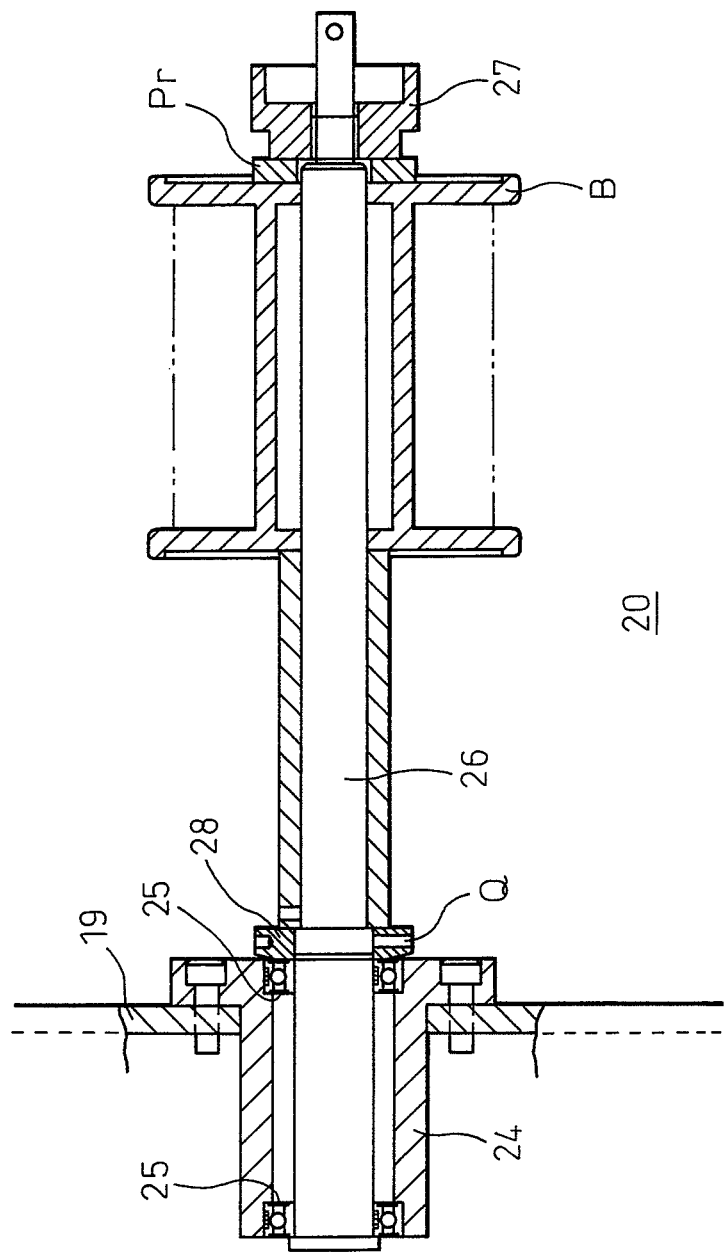

WIRE BOBBIN HOLDER OF BOBBIN CASSETTE IN WIRING APPARATUS

This application is a National Stage Application of PCT/JP2007/069148, filed 25 Sep. 2007, and which application is incorporated herein by reference. To the extent appropriate, a claim of priority is made to the above disclosed application.

TECHNICAL FIELD

The present invention relates to a wire bobbin holder of a bobbin cassette in a wiring apparatus in which tension given to a wire can be adjusted when the wire is drawn out from a bobbin of the bobbin holder in the wiring apparatus around which the wire is wound.

BACKGROUND ART

There is provided a conventional solar cell of a wire current collecting system comprising a solar battery module in which a photosensitive semiconductor film is formed on the cell and a large number of current collecting wires are arranged in parallel with each other and stuck on the cell.

The solar battery module is formed out of an appropriate number of solar cells, which are connected to each other, described above.

In manufacturing the solar cell, it is necessary that a large number of current collecting wires are stuck in parallel to each other on a metallic base board on which a photosensitive semiconductor film is formed. Therefore, a method is adopted in which a plurality of bobbins around which individual wires are independently wound are arranged in bobbin cassettes and wires are drawn out from these large number of bobbins and extended on a metallic base board of a work in a wiring apparatus. FIG. 12 shows a solar cell 1 made by such a method. In this solar cell 1, the adhesive double coated tape 3 is stuck at both ends of the substrate 2 of prescribed standard size. On the substrate 2, 42 pieces of fine wires 4 made of copper and coated with a conductive film, for example, the diameters of which are 0.15 mm, are laid at an interval of 5 mm. After the wires are laid, plus copper tab 5 is deposited.

As a method of drawing out such a wire 4 of a small diameter, a method is adopted in which a flange of a bobbin is set on the lower side and fixed and the wire is drawn out while the wire 4 is being unfastened. However, since a conductive film is coated on a surface of the wire 4, it is difficult to draw out the wire 4 by the above method. Accordingly, a method is adopted in which each bobbin is fixed at each bobbin holder and while the bobbin is being rotated, the wire is drawn out.

Referring to FIG. 13, an example of the manufacturing apparatus 10 used for manufacturing the above solar cell 1 will be briefly explained here.

Manufacturing apparatus 10 (wiring apparatus 10) substantially includes: a bobbin cassette 11; and a wiring machine 12. Wiring machine 12 includes: a cutter unit 13 used for returning a wire; a gripper unit 24 used for returning a wire; a unit 14 for removing looseness of the wire; a level difference roller unit 15; a gripper unit 16; a cutter unit 17; and a unit 18 used for holding the front and rear ends of the cutter.

In the bobbin cassette 11, a plurality of wire bobbin holders 20 (in this case, 21 wire bobbin holders) are respectively arranged on both sides of the frame 19. Wire bobbins B are respectively set in these wire bobbin holders 20. The wire W is drawn out from the lower side of each wire bobbin B and guided by the wire guide 21. In the wire guide 22 on the top side, 7 the wires are guided in parallel. Finally, in the cassette portion wire holding gripper 23, 42 of wires W are guided in parallel at a pitch of 5 mm and manually held.

The above wiring apparatus 10 is used as follows. For example, according to the official gazette of JP-A-9-27626, the following 6 steps are provided. The first step in which wires are drawn out from the bobbins in parallel, around which wires of prescribed number are respectively independently wound, and held by the gripper in a lump; the second step in which the wires held in a lump are drawn out from the first end portion of the work to the second end portion; the third step in which the forward end portions of the wires are pressed against the second end portion of the work so that the forward end portions of the wires are stuck; the fourth step in which holding of the forward end portions of the wires is released so that the gripper is retracted; the fifth step in which the rear end portions of the wires are pressed against the first end portion of the work so that the rear end portions of the wires are stuck; and the sixth step in which the rear end portions of the wires are cut off in a lump on the worker's side of the first end portion.

A specific means for carrying out a method, in which each bobbin is fixed at each bobbin holder and each wire is drawn out while the bobbin is being rotated, is shown by the bobbin holder 20 provided in the bobbin cassette 11 of the wiring apparatus 10 in FIG. 14.

In this case, the bobbin holder 20 includes a bobbin holder shaft 26 pivotally held by the holder 24, which is fixed at the frame 19 in the bobbin cassette 11, through the supporting bearing 25. At this bobbin holder shaft 26, the wire bobbin B is fixed by the bobbin lock nut 27 through the pushing ring Pr.

On the supporting bearing 25 of the bobbin holder shaft 26, the bearing nut 28 is mounted in such a manner that the bearing nut 28 comes into contact with the supporting bearing 25. When the bearing nut 28 is tightened to the bobbin holder shaft 26 by the tightening screw Q so that pre-load can be given, at the time of drawing out the wire W from the wire bobbin B, an appropriate braking force is applied to the wire bobbin B, so that the tension applied to the wire W can be adjusted.

However, when the above method of adjusting the tension given to the wire W is adopted, the following problems may be encountered.

(1) Since the tension applied to the wire W is low, i.e., since the tension applied to the wire W is 30 to 40 g, it is difficult to adjust the braking force. Therefore, when the wire is drawn out at high speed, i.e., when the wire is drawn out by at a length of 350 mm in 1.5 seconds, the wire W is broken.

(2) When the pre-load is reduced, at the time of drawing out the wire at high speed, the wire W is excessively drawn out by the inertia of the bobbin B and the length of the wire excessively drawn out exceeds 180 mm, which cannot be absorbed by the level difference roller unit 15. Accordingly, the apparatus will stall.

(3) The winding diameter of the bobbin B, around which the wire W is wound, is changed from 35 mm to 70 mm by the wire W to be wound. Therefore, the torque necessary for drawing out the wire is changed by the winding diameter of the bobbin B round which the wire W is wound. Therefore, when it is intended that the tension applied to the wire W is kept constant, it is impossible for the braking force to cope with the change in the torque necessary for drawing out the wire. Accordingly, there are problems in which the wire W is cut or drawn out by an excessive length.

Further, when even one of wire W to be laid is cut, operation of the entire apparatus must be stopped. In order to restore the wiring apparatus 10, the worker must bring the wire W, which has been cut, to the wire holding gripper 23 of the cassette portion and after all the wires have been held by the wire holding gripper 23 of the cassette portion, all of the wires W must be cut off and the unnecessary wires W must be removed. After that, the wires W are delivered from the cutter unit 13 used for wire restoration to the normal gripper unit 16. Such restoration work take times, and, which results in the production line being stopped and the wires are then stored in a buffer. Accordingly, the normal production is stopped and productivity is deteriorated.

The present invention has been accomplished to solve the above problems. It is an object of the invention to provide a wire bobbin holder of a bobbin cassette in a wiring apparatus in which tension applied to a wire can be adjusted when the wire is drawn out from a bobbin mounted on the bobbin holder in the bobbin cassette of the wiring apparatus around which the wire is wound.

DISCLOSURE OF THE INVENTION

According to the invention, there is provided a wire bobbin holder of a bobbin cassette in a wiring apparatus, which is mounted on the bobbin cassette in the wiring apparatus and holds a wire bobbin around which a current collecting wire is wound when the current collecting wire is laid in parallel on a solar cell on which a photosensitive film is formed, comprising: a bobbin holder shaft pivotally held on a frame side of the bobbin cassette, the wire bobbin being detachably attached to the bobbin holder shaft; and a wire tension adjusting mechanism for individually adjusting tension of each current collecting wire to be drawn out from the wire bobbin.

According to one embodiment of the present invention, the wire tension adjusting mechanism includes:

a winding diameter detecting means for detecting a winding diameter of a current collecting wire wound round the bobbin; and a braking means for dynamically adjusting a braking force with respect to the bobbin holder shaft according to a detection signal sent from the winding diameter detecting means.

According to one embodiment of the present invention, the winding diameter detecting means includes a non-contact-type detecting means or a detecting link, the forward end of the first portion of the arm of which pivotally comes into contact with a wire winding face of the wire bobbin, which is mounted on the bobbin holder shaft, through a detecting roller by a pushing force, and the winding diameter detecting means further includes a plurality of non-contact-type detecting means which are arranged on the forward end side of the second portion of the arm of the detecting link for each predetermined displacement angle along a displacement locus on the forward end side of the second portion of the arm passing at the time of displacement of the detection link, wherein the braking means is controlled according to a detection signal of the detecting means so that a braking force applied to the bobbin holder shaft can adjusted.

According to one embodiment of the present invention, the braking means includes: a brake shoe coming into contact with an end face of the bobbin holder shaft through a friction contacting member; and a drive means for dynamically pushing and adjusting the brake shoe, wherein a braking force is adjusted when a pushing force of the drive means is changed by an electropneumatic regulator according to a wire winding diameter of the wire bobbin.

According to one embodiment of the present invention, the wire tension adjusting mechanism includes a brake link pivotally coming into contact with a wire winding face of the wire bobbin by a spring force, and the brake link includes: a friction roller coming into contact with and rolling on a wire winding face of the wire bobbin arranged at the forward end portion of the first portion of the arm; and a coil spring, which is arranged on the side of the second portion of the arm, for pushing the friction roller so that it can be contacted with a wire winding face of the wire bobbin.

According to one embodiment of the present invention, the wire tension adjusting mechanism is comprised so that a manually pushing means can be pushed against a flange portion of a holder fixed to a frame of the bobbin cassette through a friction material member, the manually pushing means is comprised in such a manner that an outer diameter is comprised like a disk, the dimensions of which are set at values close to the outer diameter of the flange portion of the holder and that the friction material member comes into contact with a back side of the manually pushing means and that a washer coming into contact with the friction material member is interposed between the friction material member and the flange portion of the holder, and a braking force applied to the bobbin holder shaft is adjusted when a pressure contact force given to the flange portion of the holder by the friction material member is adjusted by individually operating the manually pushing means.

Referring to the accompanying drawings, embodiments of the present invention will be explained below.

BRIEF DESCRIPTION OF THE DRAWINGS

FIG. 2 is a circuit diagram showing an example of the pneumatic control circuit used for the wire bobbin holder of the bobbin cassette shown in FIG. 1.

FIG. 14 is a schematic sectional view briefly showing an example of the wire bobbin holder used for the wiring apparatus shown in FIG. 13.

BEST MODE FOR CARRYING OUT THE INVENTION

Figure 1:
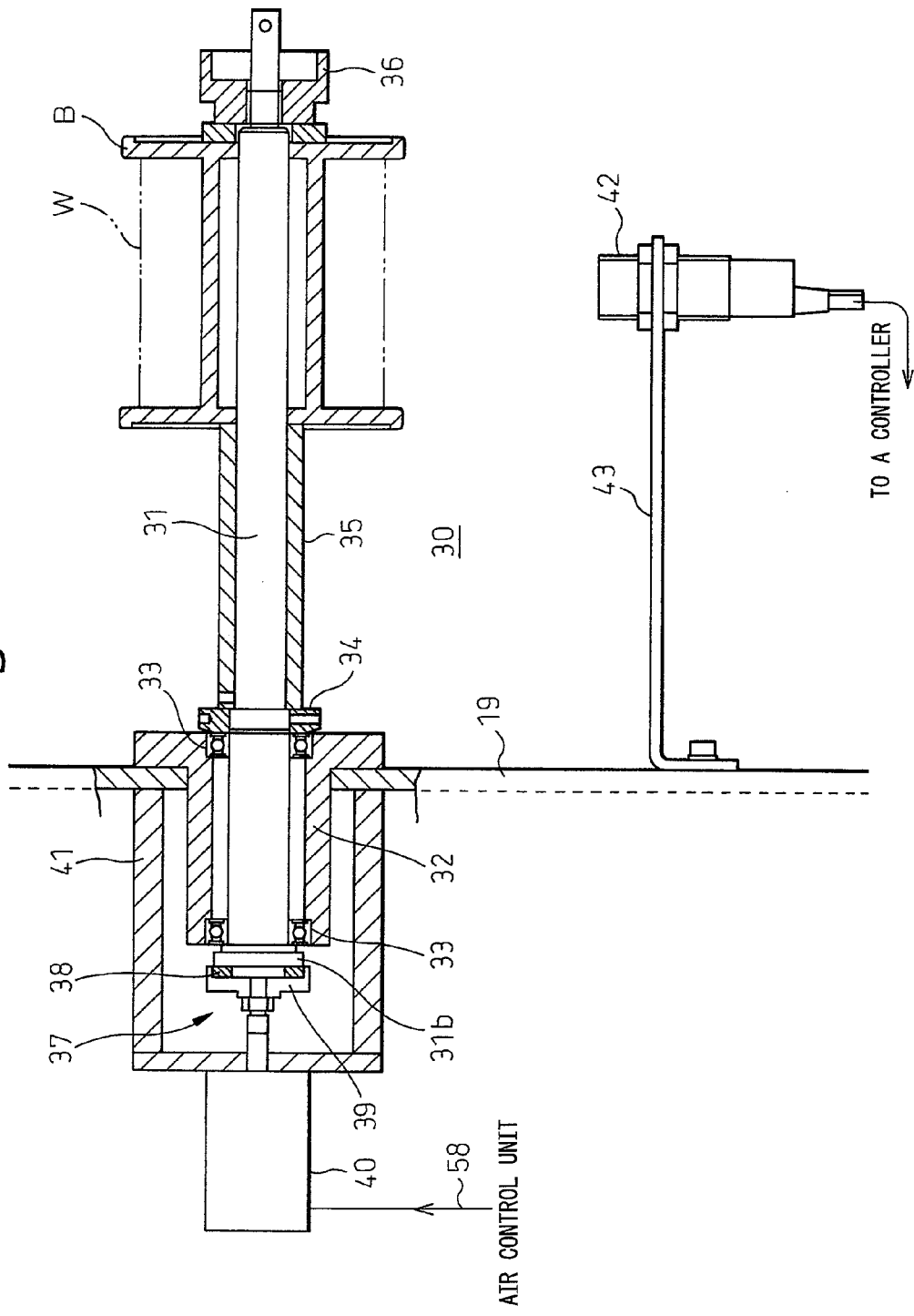
FIG. 1 is a schematic sectional view briefly showing an example of the wire bobbin holder of the bobbin cassette in the wiring apparatus of the present invention.
Figure 13:
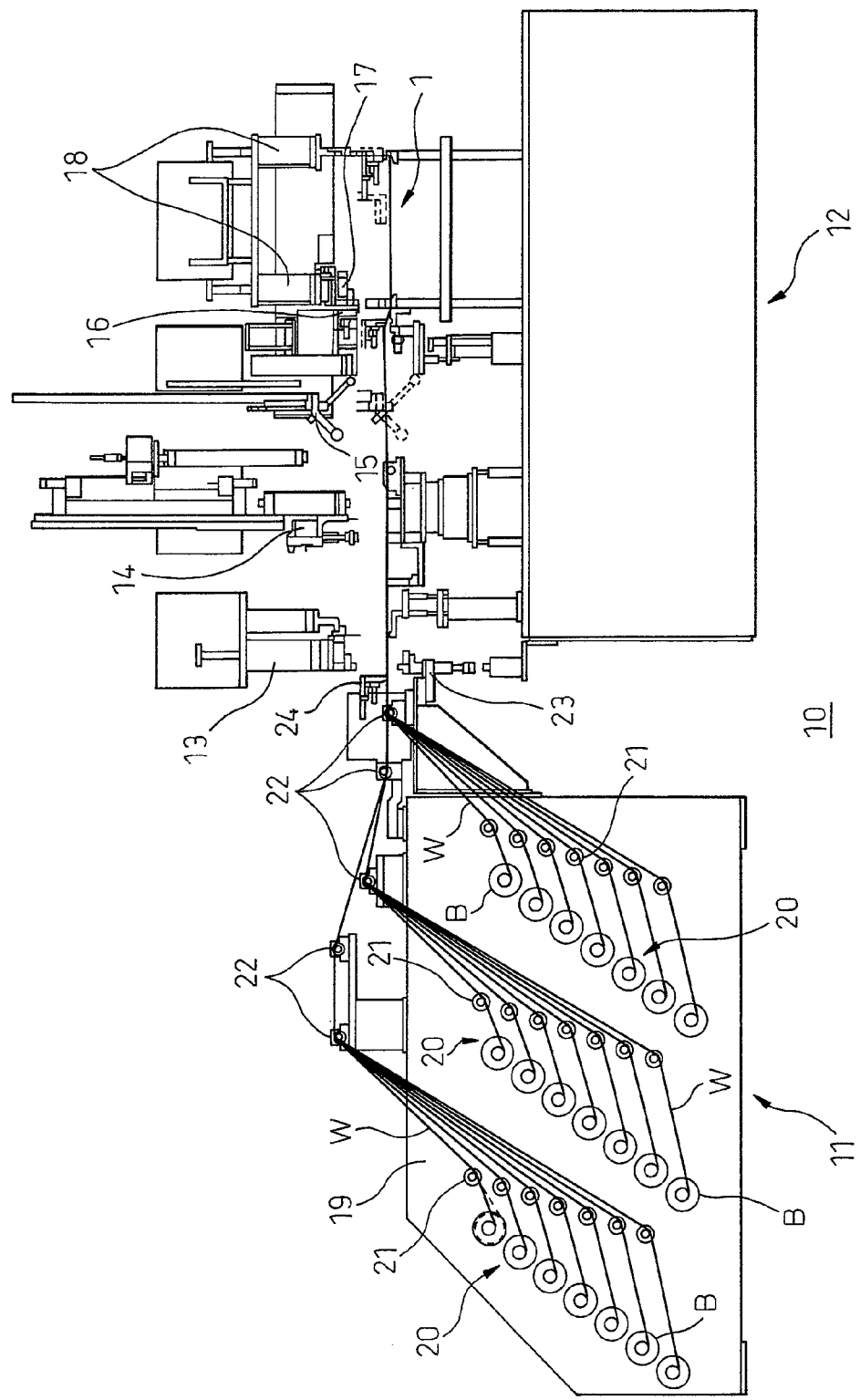
FIG. 13 is a schematic illustration explaining a composition showing an example of the wiring apparatus.

FIG. 1 shows a wire bobbin holder 30 of the present invention. This wire bobbin holder 30 is mounted on the bobbin cassette 11 of the wiring apparatus 10 used for manufacturing a solar cell of the wire current collecting system shown in FIG. 13. In this connection, an outline of the composition of the wiring apparatus 10 and the bobbin cassette 11 has already been explained before. Therefore, no further explanation will be provided.

The wire bobbin holders 30 are arranged as follows. On both sides of the frame 19 of the bobbin cassette 11, for example, 42 pieces of wire bobbin holders 30 are arranged, that is, 21 pieces of wire bobbin holders 30 are arranged on one side, and these 21 pieces of wire bobbin holders 30 are arranged in 3 rows, wherein each row includes 7 wire bobbin holders. Each wire bobbin holder 30 has a bobbin holder shaft 31 which is pivotally held.

This bobbin holder shaft 31 is pivotally held by the holder 32, which is fixed at the frame 19, through the supporting bearing 33. On the bobbin holder shaft 31, the bearing nut 34, which is a pre-load means, is mounted coming into contact with the supporting bearing 33. The wire bobbin B is inserted into the bobbin holder shaft 31 through the space pipe 35. The bobbin lock nut 36 is screwed from the forward end portion of the pin holder shaft 31 through the pushing ring Pr, so that the wire bobbin B can be tightened and fixed by the bobbin lock nut 36.

The base end side of the bobbin holder shaft 31 is exposed from the holder 32 which pivotally holds the bobbin holder shaft 31 through the supporting bearing 33. On this base end side, the braking pushing portion 31b, which is integrated with the bobbin holder shaft 31 into one body, is protruded.

The braking means 37, which is a wire tension adjusting mechanism, is arranged opposed to the braking pushing portion 31b. When the braking means 37 is worked by the driving means described later and the braking pushing portion 31b is pushed against the base end side of the bobbin holder shaft 31, a braking force applied to the bobbin holder shaft 31 is adjusted.

The braking means 37 is composed as follows. The brake shoe 39, which comes into contact with the braking pushing portion 31b of the bobbin holder shaft 31 through the friction contacting member 38 such as a felt member, is pushed to the bobbin holder shaft 31 in the axial direction by the driving cylinder 40 which is a driving means. The driving cylinder 40 is fixed at the supporting frame 41 which is arranged surrounding the holder 32 fixed to the frame 19.

The driving cylinder 40 is an air cylinder worked by the air pressure controlled by the pneumatic control circuit described later.

With respect to the wire bobbin B fixed at the bobbin holder shaft 31 of the wire bobbin holder 30 described above, the wire winding diameter sensor 42 for detecting a wire winding diameter of the wire W of the wire bobbin B is attached to the mounting bracket 43 arranged by the side of the wire bobbin holder 30. Each component is arranged so that a detecting face of the wire winding diameter sensor 42 can catch an outer circumferential face of the wire W wound around the wire bobbin B.

An example of the wire winding diameter sensor 42 is a non-contact detecting means such as an ultrasonic sensor or a linear sensor. A detection signal obtained by the wire winding diameter sensor 42 is sent to a controller not shown in the drawing. According to the detection signal, the controller controls so that a signal for controlling the air pressure can be sent to the pneumatic control circuit by the electropneumatic regulator (described later). In this way, a pushing force of the air cylinder 40 of the braking means 37 is controlled.

Figure 2:
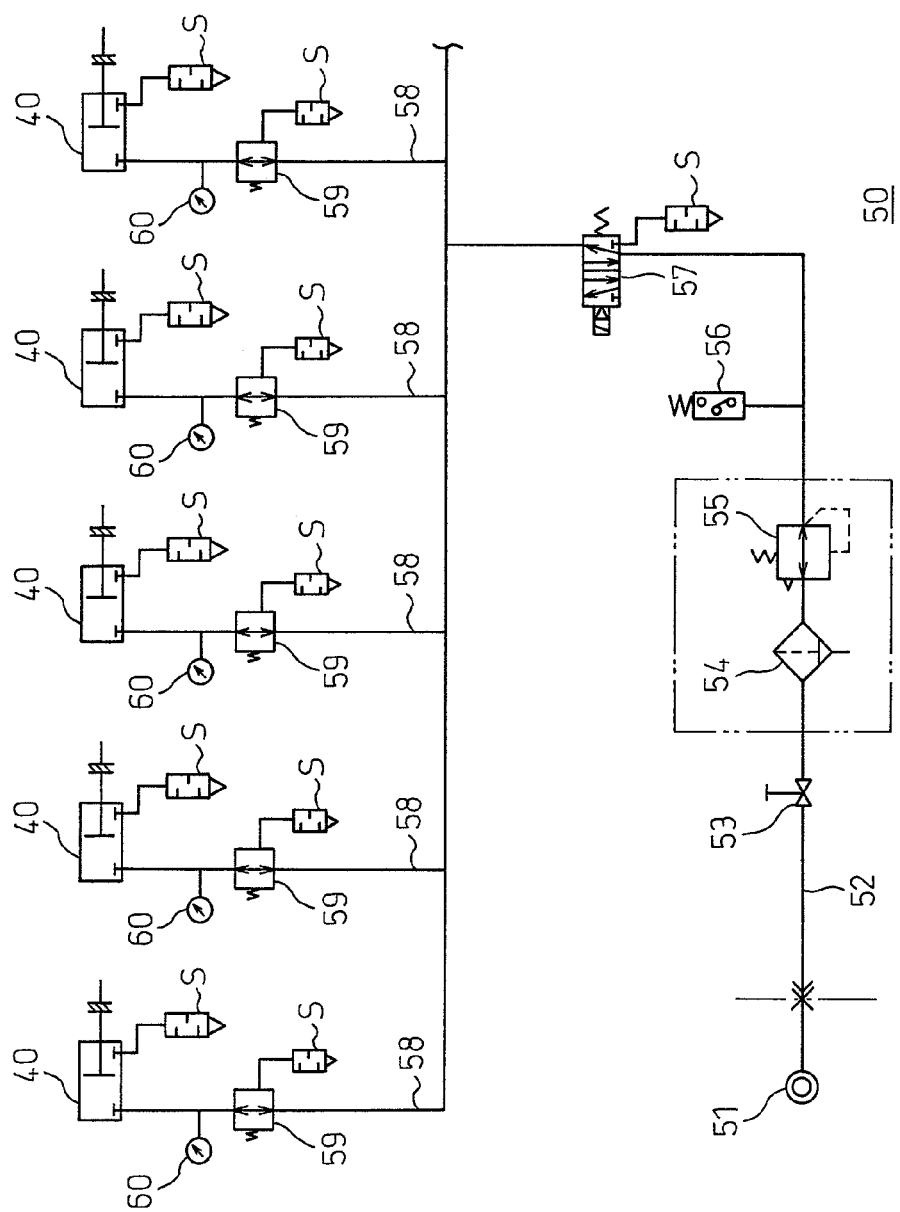
FIG. 2 is

FIG. 2 shows an example of the pneumatic control circuit 50 for controlling a pushing force of the air cylinder 40 of the control means 37 which is a wire tension adjusting mechanism.

The pneumatic control circuit sends compressed air, which is supplied from the pneumatic source 51 through the air supply passage 52, to the air cylinder 40 of the braking means 37 provided in each wire bobbin holder 30 as the compressed air, the pressure of which has been respectively controlled.

The opening and closing valve 53, the air filter 54, the regulator 55, the pressure switch 56 and the electromagnetic valve 57, which is a direction switching valve, are arranged in the air supply passage 52 in the pneumatic control circuit 50. In this way, the air branch supply passage 58 is formed which is laid from the air supply passage 52 to the air cylinder 40 of the braking means 37 provided in each wire bobbin holder 30. The electropneumatic regulator 59 and the pressure gauge 60 are arranged in the air branch supply passage 58 connected to each air cylinder 40. In this connection, the reference mark S represents a silencer.

The wire bobbin holder 30 of the present invention is composed as described above. Operation of the wire bobbin holder 30 will be explained below.

When the step, in which the wire is laid on the solar cell 1, is carried out, operation is executed as follows. In order to mount the wire bobbin B, around which the wire W is wound, on each wire bobbin holder 30 arranged on both sides of the frame 19 of the bobbin cassette 11 of the wiring apparatus 10, the wire bobbin B is inserted into the bobbin holder shaft 31. Then the bobbin lock nut 36 is screwed from the forward end portion of the bobbin holder shaft 31 so as to tighten and fix the wire bobbin B. In this connection, a pre-load is previously applied to the supporting bearing 33, which pivotally holds the bobbin holder shaft 31, so that an appropriate braking force can be given by the bearing nut 34 at the time of drawing out the wire W from the wire bobbin B.

From the wire bobbin B mounted as described above, the wire W is drawn out from the lower side of each wire bobbin B being guided by the wire guide 21. At the place of the cassette portion wire holding gripper 23, 42 wires W are cramped being guided by the wire guide 22 on the top portion side. Next, the wire W is supplied to the gripper 24 of the wiring machine 12, the looseness removing unit 14, the level difference roller unit 15, the gripper unit 16, the cutter unit 17 and the cutter front and rear end holding unit 18. In this way, the wiring step, in which the wires W are extended on the solar cell 1, that means a work, is executed by the wiring machine 12.

When the above wiring step is continued, the wire W wound around the wire bobbin B is drawn out and the wire winding diameter is gradually reduced. The wire drawing torque is changed by a reduction of the wire winding diameter.

At this time, the wire winding diameter sensor 42 arranged by the side of the wire bobbin holder 30 detects a wire winding diameter of the wire W wound around the wire bobbin B. Therefore, a detection signal picked up by the wire winding diameter sensor 42 is sent to the controller. The controller controls the air pressure in the pneumatic control circuit 50 according to the detection signal. Accordingly, a pushing force of the air cylinder 40 of the braking means 37 can be controlled. In this connection, the wire winding diameter sensor 42 is a non-contact detection means. Therefore, it is possible for the wire winding diameter sensor 42 to detect the wire winding diameter of the wire W without applying any load to the rotation of the bobbin holder shaft 31 mounted on the bobbin B.

Due to the foregoing, the brake shoe 39 is pushed in the axial direction to the brake pushing portion 31*b* of the bobbin holder shaft 31 through the friction contacting member 38 such as a felt member so that a braking force of the bobbin holder shaft 31 can be adjusted and tension of the wire W can be kept at a substantially constant value when the wire W is draw out.

Figure 3:
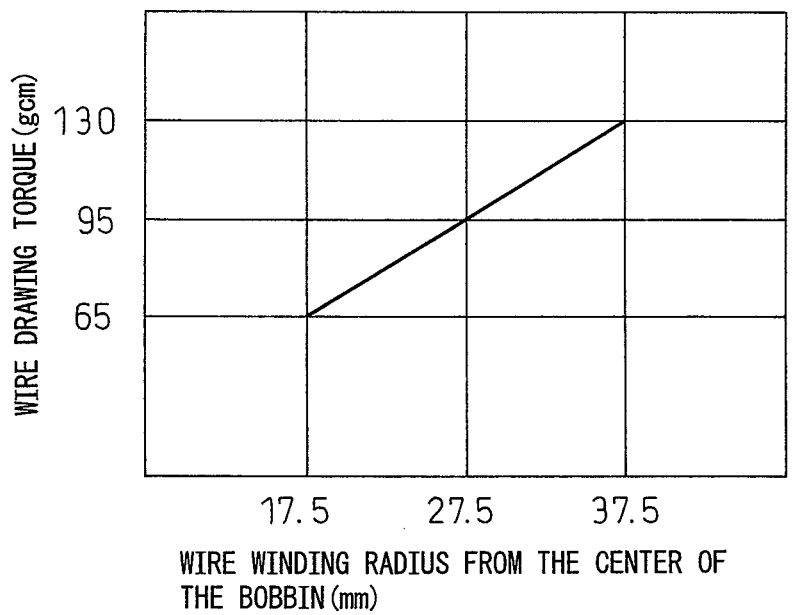
FIG. 3 is a graph showing a relation between the wire winding radius from the center of the bobbin and the wire drawing torque in the wire bobbin holder of the bobbin cassette shown in FIG. 1.
Figure 4:
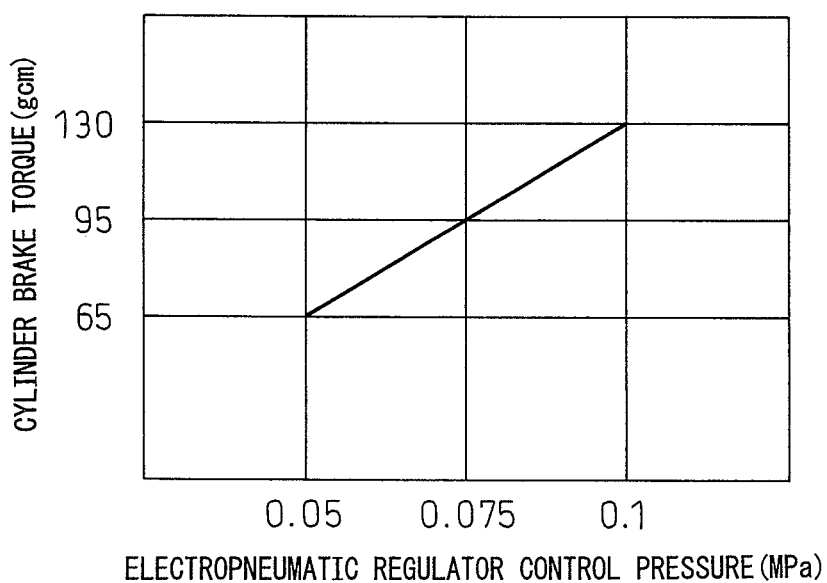
FIG. 4 is a graph showing a relationship between the electropneumatic regulator control pressure in the pneumatic control circuit and the cylinder brake torque in the wire bobbin holder of the bobbin cassette shown in FIG. 1.

FIG. 3 is a graph showing a relation between the wire drawing torque and the wire bobbin winding diameter. FIG. 4 is a graph showing a relation between the braking torque given by the air cylinder 40 and the air pressure controlled by the electropneumatic regulator 59 in the case where the coefficient of friction of the friction contacting member 38 such as a felt member is 0.2. In this case, the air cylinder 40 is a low friction cylinder.

From the graph explained above, it can be found out that a change in the wire drawing torque is proportional to the bobbin wire diameter and that the cylinder brake torque is linearly changed in accordance with a change in the air pressure controlled by the electropneumatic regulator 59. Accordingly, it possible to know that the braking torque generated by the air cylinder 40 can be made to follow the wire drawing torque determined according to the wire winding diameter.

The wire bobbin holder of the bobbin cassette in the wiring apparatus of the present invention can be executed as follows. In this connection, like reference marks are used to indicate substantially like components in the wire bobbin holder 30 described before and the wire bobbin holder of the bobbin cassette in the wiring apparatus of the present invention, and therefore, further explanation is omitted.

In this wire bobbin holder 30, the wire tension adjusting mechanism is composed in such a manner that a braking force given to the bobbin holder shaft 31 can be adjusted stepwise according to the wire winding diameter of the current collecting wire W. Therefore, the wire tension adjusting mechanism includes a contact detecting means for mechanically detecting the wire winding diameter of the wire W of the wire bobbin B. Concerning this matter, refer to FIGS. 5 and 6. Although not shown in the drawing, the air cylinder 40, which is a braking means 37 for adjusting torque of the bobbin holder shaft 31 with respect to the brake pushing portion 31*b* on the base end side of the bobbin holder shaft 31, is mounted on this wire bobbin holder 30.

Concerning the contact detecting means, the L-shaped detecting link 70 is provided, which pivotally comes into contact with the wire winding face of the wire W of the wire bobbin B mounted on the bobbin holder shaft 31 by a spring force. This L-shaped detecting link 70 is pivotally supported by the stand 71 arranged in parallel with the bobbin holder shaft 31 by the side of the wire bobbin holder 30. This L-shaped detecting link 70 is connected to the detecting roller 72 arranged at the forward end of the detecting arm 70*a*, which is the first portion of the arm, and directly coming into contact with and rolling on the wire winding face of the wire W of the wire bobbin B. Further, this L-shaped detecting link 70 is connected to the coil spring 73 arranged on the long arm 70*b* side, which is the second portion of the arm, and pushing the detecting roller 72 provided at the forward end portion of the detecting arm 70*a* to the wire winding face of the wire W of the wire bobbin B so that the detecting roller 72 can be in contact with the wire winding face.

Further, on the forward end side of the long arm 70*b* of the L-shaped detecting link 70, the non-contact-type detecting means 74*a*, 74*b*, 74*c* (the proximity sensors or the optical sensors), which are arranged at predetermined intervals along the displacement locus passing through when the forward end side of the long arm 70 is displaced, are mounted on the fixture 75.

The detecting signals detected by the non-contact-type detecting means 74*a*, 74*b*, 74*c* are sent to the controller as electric signals. In the controller, by the air pressure controlled by the electropneumatic regulator 59 in the pneumatic control circuit 50, the braking torque generated by the air cylinder 40 is made to follow by an action of the air cylinder 40.

When the L-shaped detecting link 70 follows a reduction of the wire winding diameter when the wire W is drawn out from the wire bobbin B mounted on the bobbin holder shaft 31, the L-shaped detecting link 70 is displaced. Due to the foregoing, the long arm 70*b* of the L-shaped detecting link 70 is displaced and the displacement is detected by the non-contact-type detecting means 74*a*, 74*b*, 74*c* arranged at predetermined intervals (at displacement angles). Due to the foregoing, the position of the L-shaped detecting link 70 can be caught. According to the degree of the displacement, the braking force with respect to the bobbin holder shaft 31 is adjusted stepwise.

For example, operation is executed as follows. By the non-contact-type detecting means 74*a*, it is detected that the wire winding diameter of the wire W of the wire bobbin B is the maximum. The electric signal representing that the wire winding diameter is the maximum is sent to the controller. By the controller, the air cylinder 40 is operated by the air pressure controlled by the electropneumatic regulator provided in the pneumatic control circuit 50. A braking force with respect to the bobbin holder shaft 31 is made to correspond to the maximum wire winding diameter of the wire W. When the non-contact-type detecting means 74*b* detects that the wire winding diameter of the wire W of the bobbin B is an intermediate diameter, a braking force with respect to the bobbin holder shaft 31 is made to correspond to the intermediate wire winding diameter of the wire W. Further, when the non-contact-type detecting means 74*b* detects that the wire winding diameter of the wire W of the bobbin B is the minimum diameter, a braking force with respect to the bobbin holder shaft 31 is made to correspond to the minimum wire winding diameter of the wire W. In this way, the braking torque with respect to the bobbin holder shaft 31 is followed stepwise.

Figure 5:
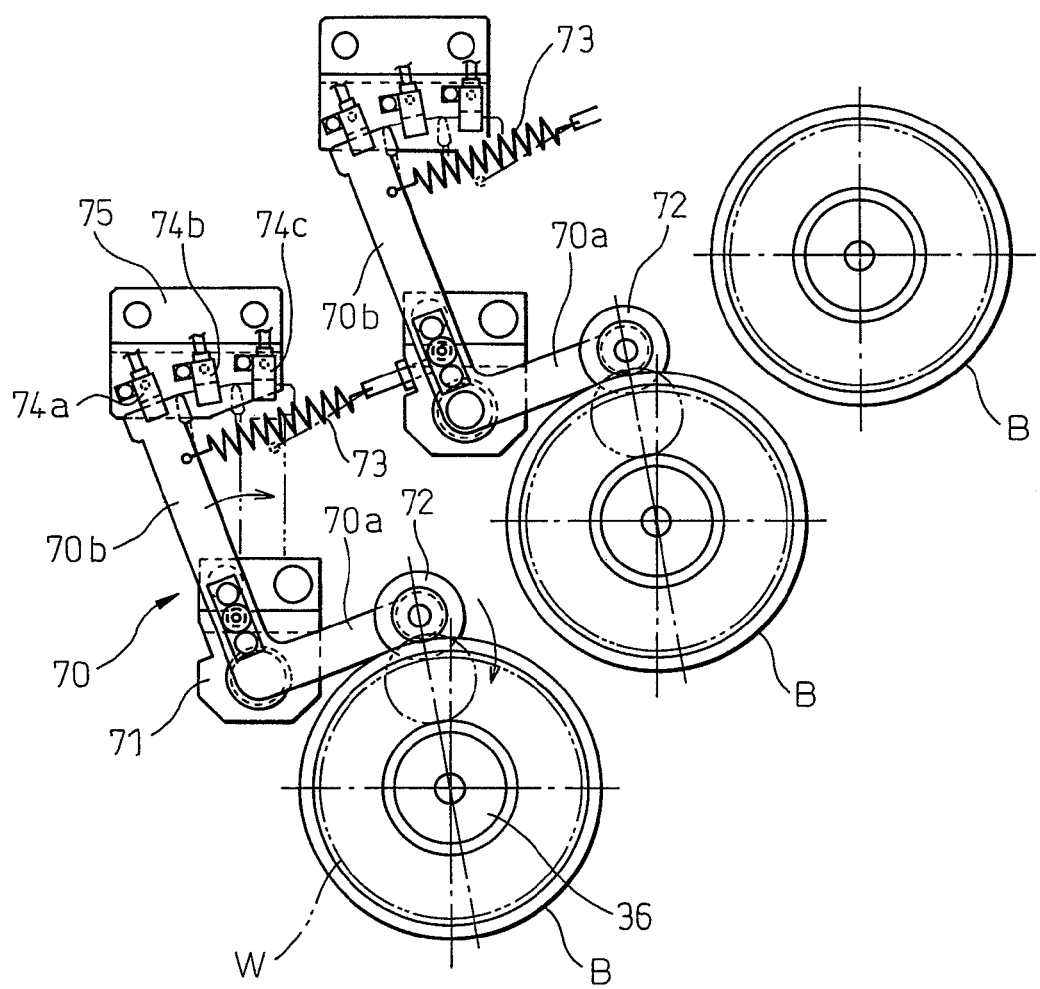
FIG. 5 is a schematic illustration for explaining a mechanism showing another example of the wire bobbin holder of the bobbin cassette in the wiring apparatus of the present invention.
Figure 6:
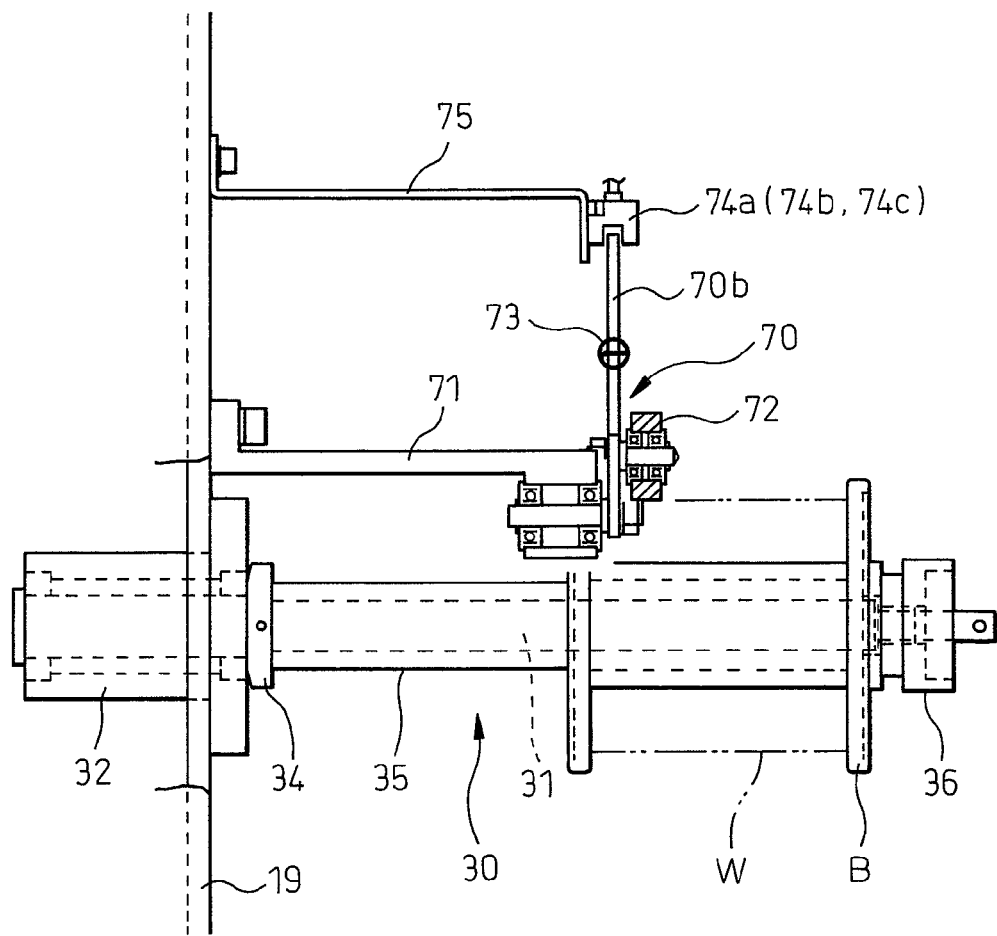
FIG. 6 is a side view for explaining the wire bobbin holder shown in FIG. 5.

In the wire bobbin holder 30 described above, at the time of starting the operation, the wire winding diameter of the wire W of the wire bobbin B is the maximum and the L-shaped detecting link 70 is located at the position shown by the solid line in FIG. 5 being controlled by the detection signal of the non-contact-type detecting means 74*a* on the forward end side of the long arm 70*b*. Therefore, the electric signal representing that the wire winding diameter of the wire W of the wire bobbin B is the maximum is sent to the controller. In the controller, by the air pressure controlled by the electropneumatic regulator 59 in the pneumatic control circuit 50, the air cylinder 40 is operated, so that a braking force with respect to the bobbin holder shaft 31 can be adjusted at a value corresponding to the maximum wire winding diameter of the wire W.

When the wire W is drawn out from the wire bobbin B and the wiring step is continued, the wire winding diameter is gradually reduced and the L-shaped detecting link 70 is displaced clockwise in the drawing by the coil spring 73. When a detecting signal is obtained by the non-contact-type detecting means 74b provided on the forward end side of the long arm 70b, it is detected that the wire winding diameter of the wire W of the wire bobbin B has become an intermediate diameter and this electric signal is sent to the controller. In the controller, by the air pressure controlled by the electropneumatic regulator 59 in the pneumatic control circuit 50, the air cylinder 40 is operated. In this way, the braking force with respect to the bobbin holder shaft 31 can be adjusted at a value corresponding to the intermediate diameter of the wire winding diameter of the wire W.

Further, when the wire W is drawn out from the wire bobbin B and the wiring step is continued, the L-shaped detecting link 70 is further displaced clockwise and a detection signal is obtained by the non-contact-type detecting means 74c provided on the forward end side of the long arm 70b. Then, it is decided that the wire winding diameter of the wire W of the wire bobbin B is reduced to the minimum diameter and the electric signal is sent to the controller. The controller works the air cylinder 40 by the air pressure controlled by the electropneumatic regulator 59 in the pneumatic control circuit 50, so that a braking force with respect to the bobbin holder shaft 31 can be adjusted at a value corresponding to the minimum value of the wire winding diameter of the wire W.

As described above, by the combination of the contact type detecting means, which mechanically detects the braking torque with respect to the bobbin holder shaft 31, with the non-contact-type detecting means, the braking torque is made to correspond to the wire winding diameter of the wire W. Therefore, it is possible to avoid the problem of a wire breaking while the wire is being drawn out.

The wire bobbin holder of the bobbin cassette in the wiring apparatus of the present invention can be executed as follows.

The tension of the wire bobbin holder 30 of this embodiment can be maintained substantially constant by the wire tension adjusting mechanism in such a manner that the elastic friction roller 81 is directly contacted with a wire winding face of the wire W of the wire bobbin B and a braking force is given to the wire bobbin B. Concerning this matter, refer to FIGS. 7 and 8.

In this case, the L-shaped braking link 80, which pivotally comes into contact with the wire winding face of the wire W of the wire bobbin B by a spring force, is mounted on the wire bobbin holder 30. This braking link 80 pivotally supported by the stand 82 arranged in parallel with the bobbin holder shaft 31 by the side of the wire bobbin holder 30. The friction roller 81 coming into contact with and rolling on the wire winding face of the wire W of the wire bobbin B is mounted on the forward end portion of the first portion of the arm 80a of the braking link 80. Further, the coil spring 83, which pushes the friction roller 81 so that it can be contacted with the wire winding face of the wire W of the wire bobbin B, is mounted on the forward end side of the second portion of the arm 80b of the braking link 80.

Figure 9:
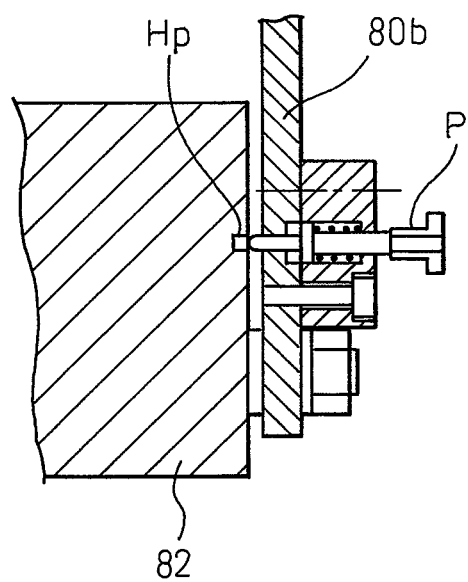
FIG. 9 is a sectional view explaining a mechanism taken on line X-X of the wire bobbin holder shown in FIG. 7.

The braking link 80 includes a locking means by which the bobbin B can be easily replaced at the time of replacement of the bobbin B. The locking means is composed as shown in FIG. 9. The braking link 80 is displaced resisting a pushing force of the coil spring 83. For example, the stopper pin p is inserted into the stopper pin hole Hp formed in the stand 82 and the braking link 80 is held so that the friction roller 81 at the forward end portion of the first portion of the arm 80a can be made to float from the wire winding face of the wire W of the wire bobbin B.

Figure 7:
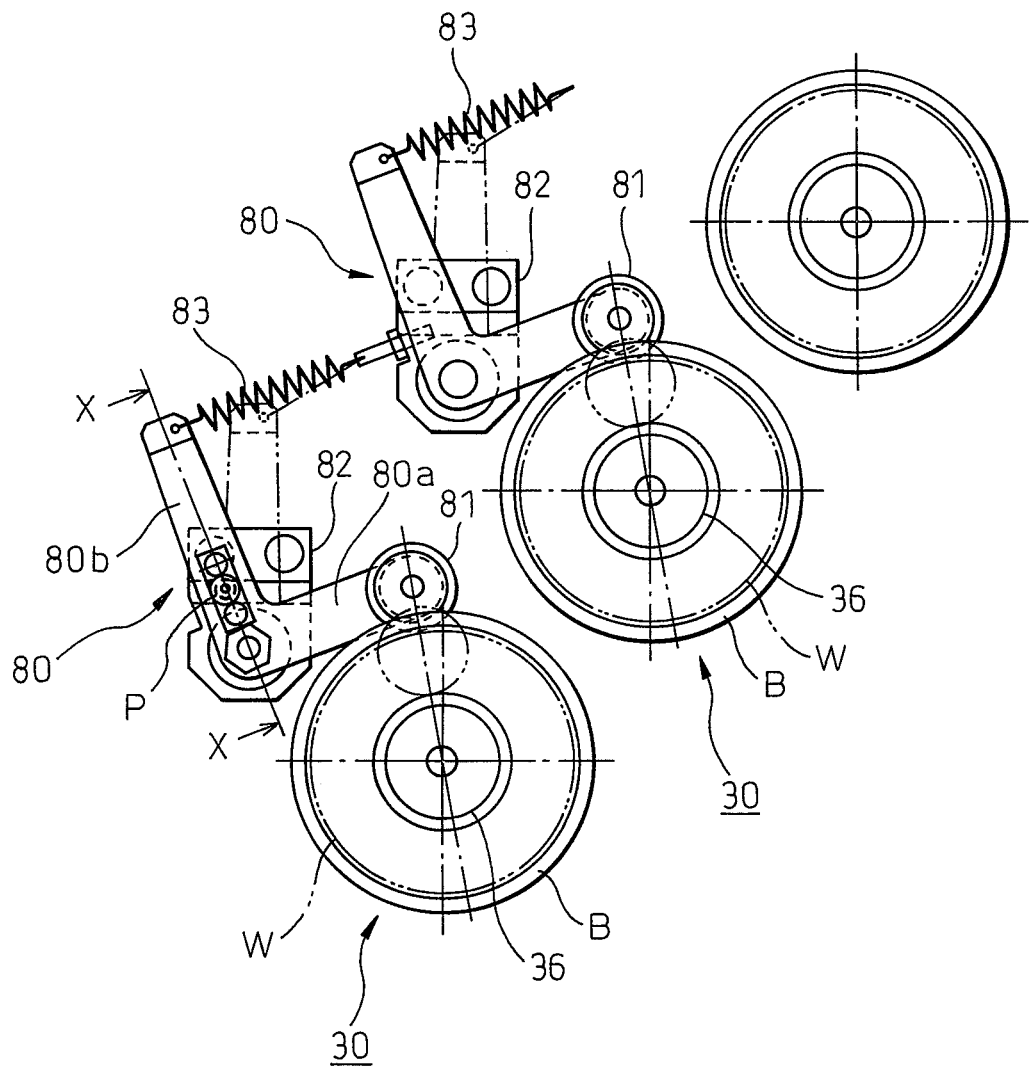
FIG. 7 is a schematic illustration for explaining a mechanism showing another example of the wire bobbin holder of the bobbin cassette in the wiring apparatus of the present invention.
Figure 8:
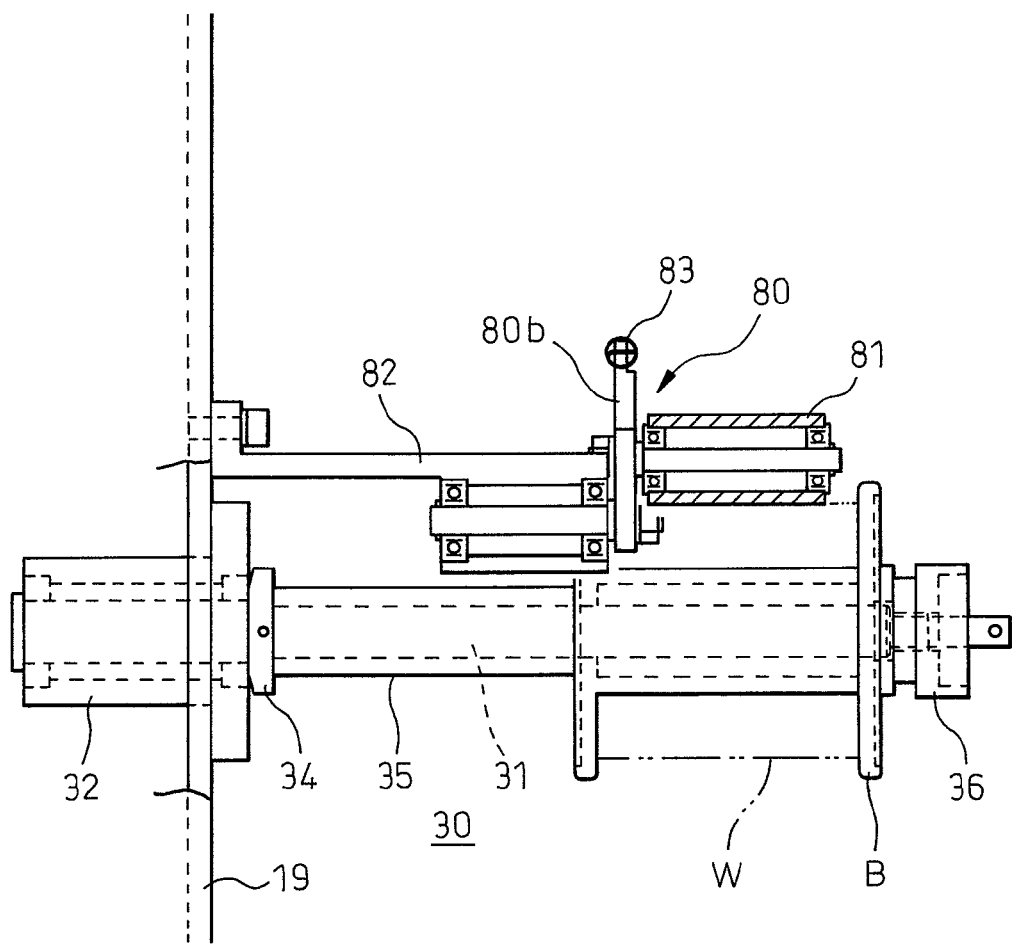
FIG. 8 is a side view for explaining the wire bobbin holder shown in FIG. 7.

In the wire bobbin holder 30 described above, right after the start of operation, while the wire winding diameter of the wire W is large, the braking link 80 is located at the position shown by the solid line resisting a pushing force of the coil spring 83 in FIG. 7. At this time, the wire winding face of the wire W is strongly pushed by the friction roller 81 being pushed by the coil spring 83. Therefore, the braking force given to the bobbin holder shaft 31 is increased to the maximum.

After that, when the wire W is drawn out and the wire winding diameter of the wire W is gradually reduced, the coil spring 83 is contracted so that its length can be returned to the natural length. Accordingly, the pushing force of the coil spring 83 is decreased. Due to the foregoing, the pushing force of the friction roller 81 to push the wire winding face of the wire W is also decreased. Therefore, the braking force is decreased. As a result, the tension applied to the wire W can be maintained substantially constant.

When the bobbin B is replaced, the braking link 80 is rotated counterclockwise and the stopper pin p is inserted into and held by the stopper pin hole Hp of the stand 82. After the bobbin B is mounted, the stopper pin is pulled out so as to release the braking link 80. Then, by the pushing force of the coil spring 83, the friction roller 81 provided at the forward end of the first portion of the arm 80a comes into contact with the wire winding face of the wire W of the wire bobbin B.

As described above, according to the wire tension adjusting mechanism of the wire bobbin holder 30 described above, even when a power source such as an electric power source or a pneumatic source is not provided, it is possible to maintain the tension applied to the wire W at a substantially constant value by adjusting the braking force given to the bobbin holder shaft 31. Accordingly, it is possible to avoid the problem of the wire W breaking during the drawing operation.

Further, the wire bobbin holder of the bobbin cassette in the wiring apparatus of the present invention can be executed as follows.

Figure 10:
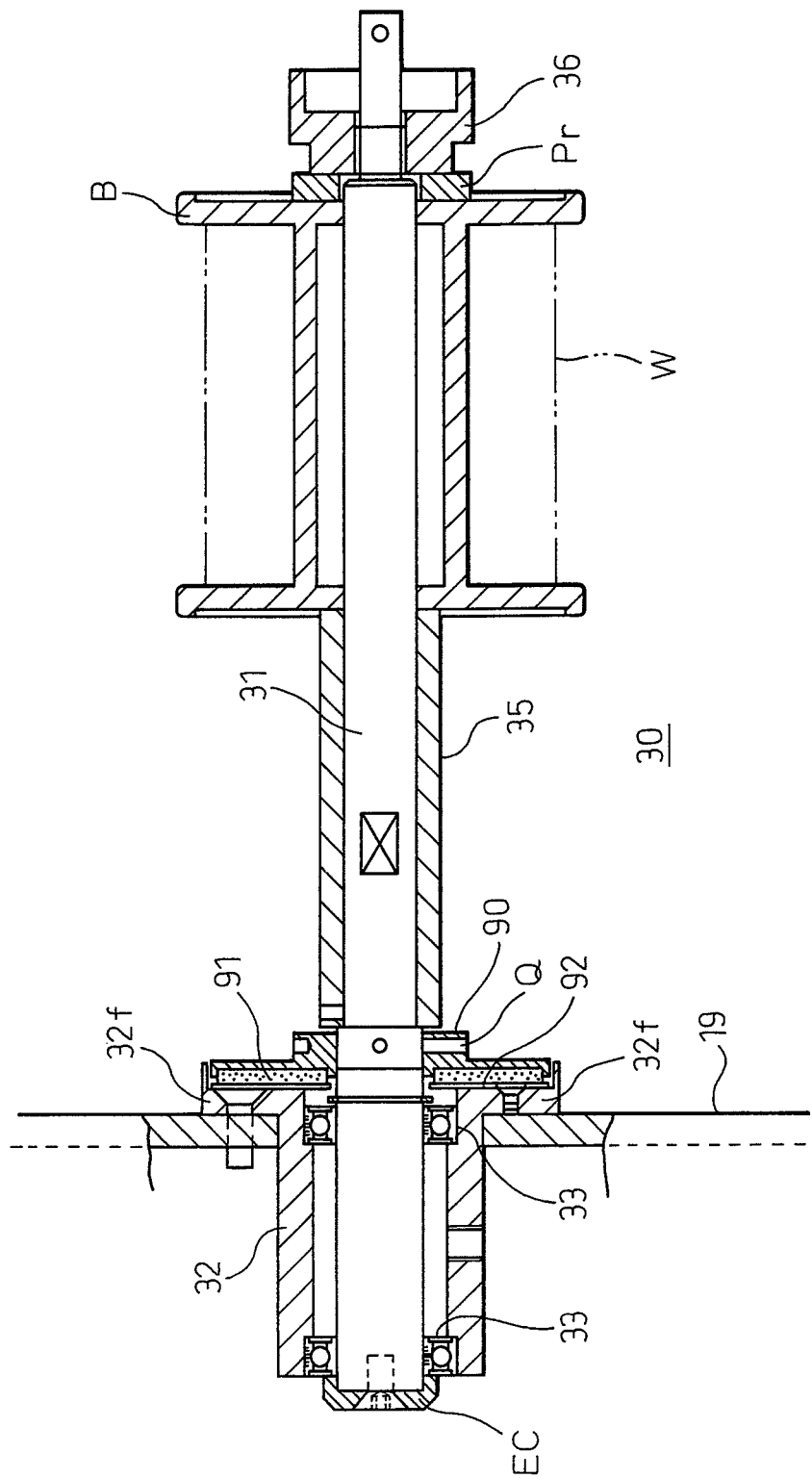
FIG. 10 is a schematic illustration for briefly explaining a mechanism showing another example of the wire bobbin holder of the bobbin cassette in the wiring apparatus of the present invention.
Figure 11:
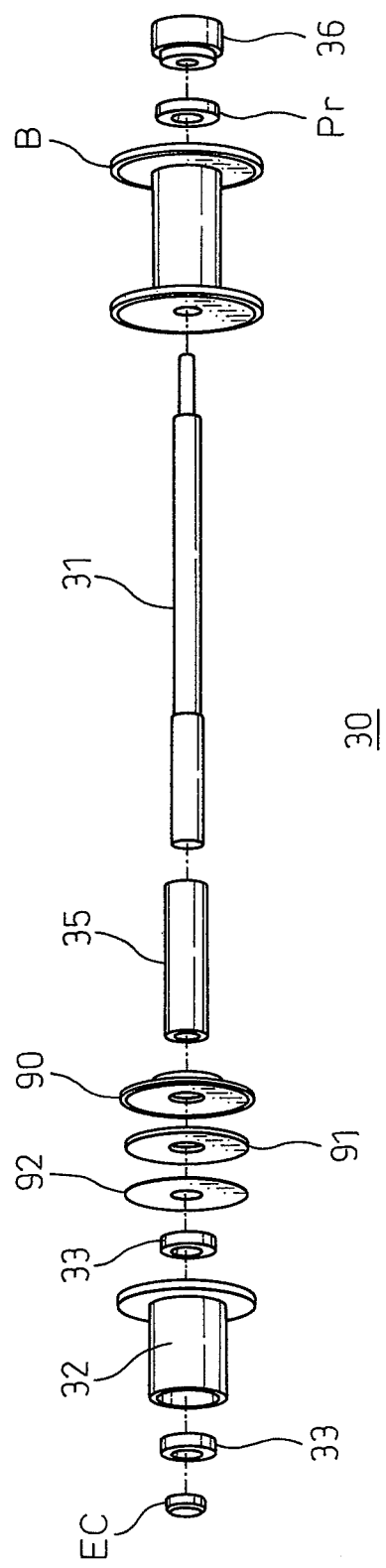
FIG. 11 is an exploded perspective view of the wire bobbin holder shown in FIG. 10.
Figure 12:
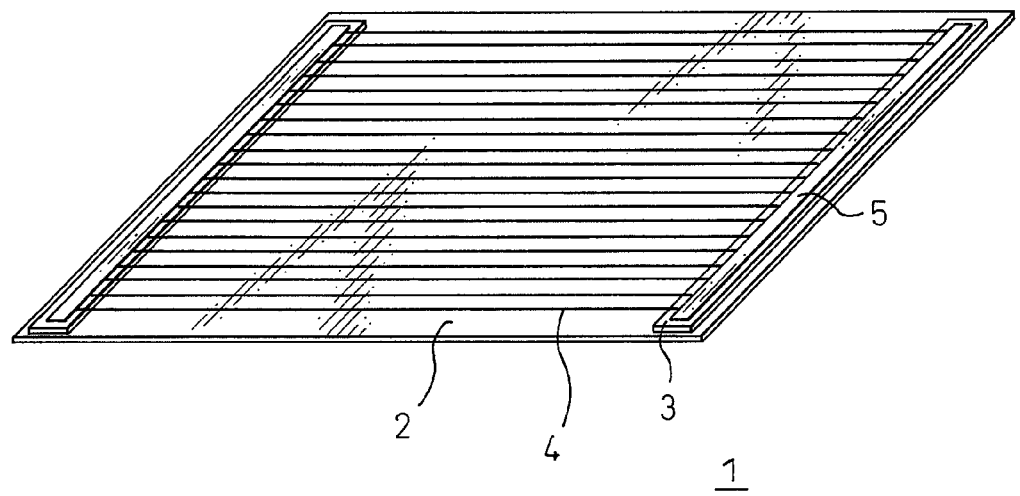
FIG. 12 is a schematic perspective view showing an example of the solar cell formed in the wiring step executed by the wiring apparatus of the present invention.

In the wire bobbin holder 30 shown in FIGS. 10 and 11, the wire tension adjusting mechanism is composed as follows. With respect to the flange portion 32f of the holder 32 fixed at the frame 19 in the bobbin cassette 32f, the brake shoe 90, which is a manually pushing means, is pushed through the disk-shaped felt member 91 made of frictional material.

In this connection, the reference mark Ec is an end cap for sealing the base end side of the bobbin holder shaft 31 of the wire bobbin holder 30. The reference mark Pr is a pushing link for stably holding the bobbin B on the holder shaft 31 being tightened by the bobbin lock nut 36.

The brake shoe 90 is formed into a disk shape, the outer diameter of which is made at a value close to the outer diameter of the flange portion 32f of the holder 32. The felt member 91 is contacted with the back side of the brake shoe 90.

Between the felt member 91 and the flange portion 32f of the holder 32, the washer 92 is interposed which comes into contact with the felt member 91.

In the wire bobbin holder 30 described above, the braking force given to the bobbin holder shaft 31 can be adjusted as follows. When the brake shoe 90, which is also used as a nut, is respectively tightened, a pushing force given to the flange portion 32f of the holder 32 by the disk-shaped felt member 91 made of frictional material is adjusted. In this connection, the reference mark Q is a fixing screw for locking the brake shoe 90.

According to the wire bobbin holder 30 having the above wire tension adjusting mechanism, being different from the wire bobbin holder 30 shown in FIG. 1, in the case where the wire tension may change in a predetermined range or in the case where a change in the wire winding diameter of the wire W of the wire bobbin B is small, it is possible to cope with the circumstances by appropriately changing the contacting force with the felt member 91 with pressure when the brake shoe 90 is tightened for each wire bobbin holder 30.

As described above, according to the present invention, even in the case of a fine wire, the diameter of which is small and the tension to be given is restricted, when the wire winding diameter of the wire wound round the bobbin is watched and the braking force given to each bobbin holder shaft is appropriately adjusted, the tension given to the wire can be maintained substantially constant. Accordingly, even when the wire is drawn out at high speed, there is no possibility that the wire is broken.

Therefore, it is possible to avoid the problem of the wire breaking and operation of the wiring apparatus is stopped and the restoration work is executed over a long period of time. Further, it is possible to avoid the problem of the wire becoming excessively loosened and the level difference roller unit cannot absorb the looseness of the wire and the wire comes off from the guide and the productivity of the apparatus is deteriorated.

LIST OF REFERENCE NUMERALS

30 . . . wire bobbin holder
31 . . . bobbin holder shaft
31b . . . braking pushing portion
32 . . . holder
33 . . . supporting bearing
34 . . . bearing nut
35 . . . space pipe
36 . . . bobbin lock nut
37 . . . braking means
38 . . . friction contacting member
39 . . . brake shoe
40 . . . driving cylinder
41 . . . supporting frame
42 . . . wire winding diameter sensor
43 . . . mounting bracket
50 . . . pneumatic control circuit
51 . . . pneumatic source
52 . . . air supply passage
53 . . . opening and closing valve
54 . . . air filter
55 . . . regulator
56 . . . pressure switch
57 . . . electromagnetic valve
58 . . . air branch supply passage
59 . . . electropneumatic regulator
60 . . . pressure gauge
70 . . . detecting link
70a . . . detecting arm
70b . . . long arm
71 . . . stand
72 . . . detecting roller
73 . . . coil spring
74a,74b,74c . . . non-contact type detecting means
75 . . . fixture
80 . . . braking link
80a . . . first portion of the arm
80b . . . second portion of the arm
81 . . . friction roller
82 . . . stand
83 . . . coil spring
90 . . . brake shoe
91 . . . felt member
92 . . . washer
B . . . wire bobbin
W . . . wire
S . . . silencer
P . . . stopper pin
Hp . . . stopper pin hole
Ec . . . end cap
Pr . . . pushing link

The invention claimed is:

1. A wire bobbin holder of a bobbin cassette in a wiring apparatus, which is mounted on the bobbin cassette in the wiring apparatus and holds a wire bobbin round which a current collecting wire is wound when the current collecting wire is laid in parallel on a solar cell on which a photosensitive film is formed, comprising:

a bobbin holder shaft pivotally held on a holder fixed to a frame of the bobbin cassette, the wire bobbin being detachably attached to the bobbin holder shaft; and a wire tension adjusting mechanism for adjusting tension of the current collecting wire to be drawn out from the wire bobbin, the wire tension adjusting mechanism including:

a non-contact winding diameter sensor for detecting a winding diameter of the current collecting wire wound round the wire bobbin, a detecting face of the winding diameter sensor being arranged so as to catch an outer circumferential face of the current collecting wire wound round the wire bobbin;

a brake shoe capable of coming into contact with an end face of the bobbin holder shaft through a friction contacting member;

an air cylinder for pushing the brake shoe toward the end face of the bobbin holder shaft, the air cylinder fixed to a supporting frame surrounding the holder; and an electropneumatic regulator for regulating a pushing force of the air cylinder according to a detection signal sent from the non-contact winding diameter sensor, wherein a braking force with respect to the bobbin holder shaft is adjusted with the electropneumatic regulator operating to regulate the pushing force according to the winding diameter of the current collecting wire wound round the wire bobbin.

2. The wire bobbin holder of the bobbin cassette in the wiring apparatus according to claim 1, wherein the winding diameter detecting means includes a non-contact detecting means or a detecting link, the forward end of the first portion of the arm of which pivotally comes into contact with a wire winding face of the wire bobbin, which is mounted on the bobbin holder shaft, through a detecting roller by a pushing force, and the winding diameter detecting means further includes a plurality of non-contact detecting means, which are arranged on the forward end side of the second portion of the arm of the detecting link for each predetermined displacement angle along a displacement locus on the forward end side of the second portion of the arm passing at the time of displacement of the detection link, wherein the braking means is controlled according to a detection signal of the detecting means so that a braking force applied to the bobbin holder shaft can adjusted.

3. The wire bobbin holder of the bobbin cassette in the wiring apparatus according to claim 1, the wire tension adjusting mechanism including a brake link pivotally coming into contact with a wire winding face of the wire bobbin by a spring force, the brake link including:

a friction roller coming into contact with and rolling on a wire winding face of the wire bobbin arranged at the forward end portion of the first portion of the arm; and a coil spring, which is arranged on the side of the second portion of the arm, for pushing the friction roller so that it can be contacted with a wire winding face of the wire bobbin.

4. The wire bobbin holder of the bobbin cassette in the wiring apparatus according to claim 1, wherein the wire tension adjusting mechanism is composed so that a manually pushing means can be pushed against a flange portion of a holder fixed to a frame of the bobbin cassette through a friction material member, the manually pushing means is composed in such a manner that an outer diameter is composed like a disk, the dimensions of which are set at values close to the outer diameter of the flange portion of the holder and that the friction material member comes into contact with a back side of the manually pushing means and that a washer coming into contact with the friction material member is interposed between the friction material member and the flange portion of the holder, and a braking force applied to the bobbin holder shaft is adjusted when a pressure contact force applied to the flange portion of the holder by the friction material member is adjusted by individually operating the manually pushing means.

\* \* \* \* \*